(12) United States Patent
Kundu et al.

(10) Patent No.: US 11,244,944 B2
(45) Date of Patent: Feb. 8, 2022

(54) TEMPERATURE COMPENSATION CIRCUITS

(71) Applicant: Taiwan Semiconductor Manufacturing Co., Ltd., Hsinchu (TW)

(72) Inventors: Amit Kundu, Hsinchu (TW); Chia-Hsin Hu, Changhua County (TW); Jaw-Juinn Horng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/227,578

(22) Filed: Dec. 20, 2018

(65) Prior Publication Data
US 2019/0131299 A1 May 2, 2019

Related U.S. Application Data

(63) Continuation of application No. 15/365,469, filed on Nov. 30, 2016, now Pat. No. 10,163,899.

(51) Int. Cl.
*H01L 27/08* (2006.01)
*H01L 27/088* (2006.01)
(Continued)

(52) U.S. Cl.
CPC .......... *H01L 27/0886* (2013.01); *G05F 1/56* (2013.01); *H01L 21/82345* (2013.01);
(Continued)

(58) Field of Classification Search
CPC .......... H01L 27/0886; H01L 21/82345; H01L 29/785; H01L 21/823431;
(Continued)

(56) References Cited

U.S. PATENT DOCUMENTS 8,598,854 B2 12/2013 Soenen et al.
8,629,694 B1 1/2014 Wang et al.
(Continued)

FOREIGN PATENT DOCUMENTS

CN 105723517 A 6/2016
JP 4259941 B2 4/2009
(Continued)

OTHER PUBLICATIONS

Jacob Baker, 'CMOS Circuit Design, Layout and Simulation', second edition, p. 132, Wiley Interscience, 2005. (Year: 2005).*
(Continued)

*Primary Examiner* — S M Sohel Imtiaz
(74) *Attorney, Agent, or Firm* — Sterne, Kessler, Goldstein & Fox P.L.L.C.

(57) ABSTRACT

The present disclosure relates generally to integrated circuits, and more particularly to low-bias voltage reference circuits. The voltage reference circuits are capable of providing highly-accurate and temperature-insensitive outputs. Specifically, the present disclosure provides complementary-to-absolute-temperature circuits with low process variation and tunable temperature coefficient.

20 Claims, 11 Drawing Sheets

(51) Int. Cl.
*H01L 21/8234* (2006.01)
*G05F 1/56* (2006.01)
*H01L 29/06* (2006.01)
*H01L 29/49* (2006.01)
*H01L 29/66* (2006.01)
*H01L 29/78* (2006.01)

(52) U.S. Cl.
CPC .......... *H01L 21/823431* (2013.01); *H01L 21/823475* (2013.01); *H01L 21/823481* (2013.01); *H01L 29/0649* (2013.01); *H01L 29/495* (2013.01); *H01L 29/4966* (2013.01); *H01L 29/4975* (2013.01); *H01L 29/66545* (2013.01); *H01L 29/785* (2013.01); *H01L 29/4958* (2013.01)

(58) Field of Classification Search
CPC ..... H01L 21/823481; H01L 21/823475; H01L 29/0649; H01L 29/495; H01L 29/4966; H01L 29/4975; H01L 29/66545; H01L 29/4958
See application file for complete search history.

(56) References Cited

U.S. PATENT DOCUMENTS

| | | | |
|---|---|---|---|
| 8,629,706 B2 | 1/2014 | Chen et al. | |
| 8,816,670 B2 | 8/2014 | Lee et al. | |
| 8,957,647 B2 | 2/2015 | Yang | |
| 9,069,370 B2 | 6/2015 | Soenen et al. | |
| 9,281,192 B2 | 3/2016 | Liu et al. | |
| 9,761,713 B2* | 9/2017 | Steigerwald | H01L 27/0886 |
| 10,163,899 B2 | 12/2018 | Kundu et al. | |
| 2005/0077885 A1* | 4/2005 | Aota | G05F 3/245 |
| | | | 323/315 |
| 2007/0034868 A1* | 2/2007 | Kim | G01R 31/31727 |
| | | | 257/48 |
| 2009/0283835 A1* | 11/2009 | Yu | H01L 21/268 |
| | | | 257/368 |
| 2010/0219804 A1 | 9/2010 | Thorp | |
| 2010/0317181 A1* | 12/2010 | Chung | H01L 21/823857 |
| | | | 438/585 |
| 2011/0248351 A1* | 10/2011 | Chiang | H01L 21/823807 |
| | | | 257/369 |
| 2012/0068261 A1* | 3/2012 | Kwon | H01L 27/0922 |
| | | | 257/331 |
| 2012/0176186 A1 | 7/2012 | Chen et al. | |
| 2012/0199909 A1 | 8/2012 | Schulz et al. | |
| 2013/0026637 A1* | 1/2013 | Hou | H01L 29/401 |
| | | | 257/770 |
| 2013/0241510 A1 | 9/2013 | Shi et al. | |
| 2013/0307516 A1 | 11/2013 | Horng et al. | |
| 2013/0320944 A1 | 12/2013 | Siao | |
| 2014/0266114 A1 | 9/2014 | Chern et al. | |
| 2015/0004779 A1* | 1/2015 | Zhu | H01L 21/02362 |
| | | | 438/592 |
| 2015/0008533 A1 | 1/2015 | Liaw | |
| 2015/0028922 A1* | 1/2015 | Turkson | H03K 17/145 |
| | | | 327/109 |
| 2015/0126023 A1* | 5/2015 | Choi | H01L 29/512 |
| | | | 438/591 |
| 2015/0168982 A1 | 6/2015 | Pilo et al. | |
| 2015/0234401 A1* | 8/2015 | Porras | G05F 3/24 |
| | | | 327/513 |
| 2015/0234403 A1 | 8/2015 | Siao et al. | |
| 2015/0357918 A1 | 12/2015 | Roth et al. | |
| 2016/0049498 A1* | 2/2016 | Cheng | H01L 29/66651 |
| | | | 257/327 |
| 2016/0276482 A1 | 9/2016 | Kim et al. | |
| 2017/0131736 A1* | 5/2017 | Acar | G05F 3/267 |
| 2017/0133372 A1* | 5/2017 | Bao | H01L 21/82345 |
| 2017/0236821 A1* | 8/2017 | Kim | H01L 27/088 |
| | | | 257/401 |
| 2018/0151562 A1 | 5/2018 | Kundu et al. | |

FOREIGN PATENT DOCUMENTS

| | | |
|---|---|---|
| JP | 2011-06643 3 A | 3/2011 |
| TW | 201539648 A | 10/2015 |
| TW | 201635542 A | 10/2016 |

OTHER PUBLICATIONS

M. Mustafa, "Threshold Voltage Sensitivity to Metal Gate Work-Function Based Performance Evaluation of Double-Gate n-FinFET Structures for LSTP Technology", World Journal of Nano Science and Engineering, 2013, 3, Mar. 17-22, 2013. (Year: 2013).*

* cited by examiner

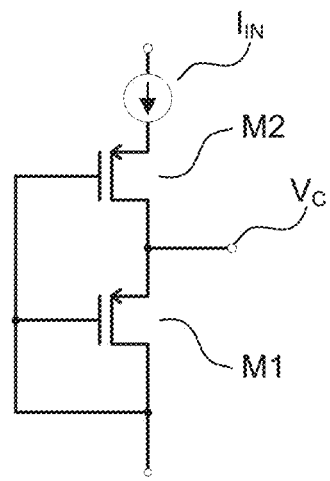
FIG. 5A
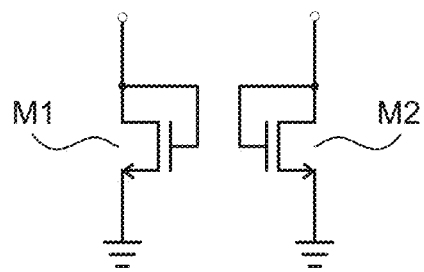   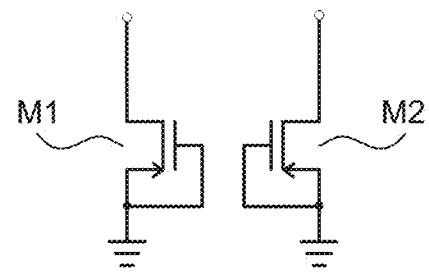
FIG. 5B              FIG. 5C

TEMPERATURE COMPENSATION CIRCUITS

CROSS-REFERENCE TO RELATED APPLICATION

This application is a continuation of U.S. application Ser. No. 15/365,469, titled "Temperature Compensation Circuits," filed on Nov. 30, 2016, which is incorporated by reference herein in its entirety.

BACKGROUND

Voltage references are circuits that are commonly used as functional blocks in mixed-mode and analog integrated circuits (ICs) such as data converters, phase lock-loops (PLL), oscillators, power management circuits, dynamic random access memory (DRAM), flash memory, and much more. A voltage reference is preferred to be nominally independent of temperature, power supply, and load variations.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIGS. 5A-5C depict various embodiments of exemplary CTAT cells, in accordance with the present disclosure.

DETAILED DESCRIPTION

Figure 1:
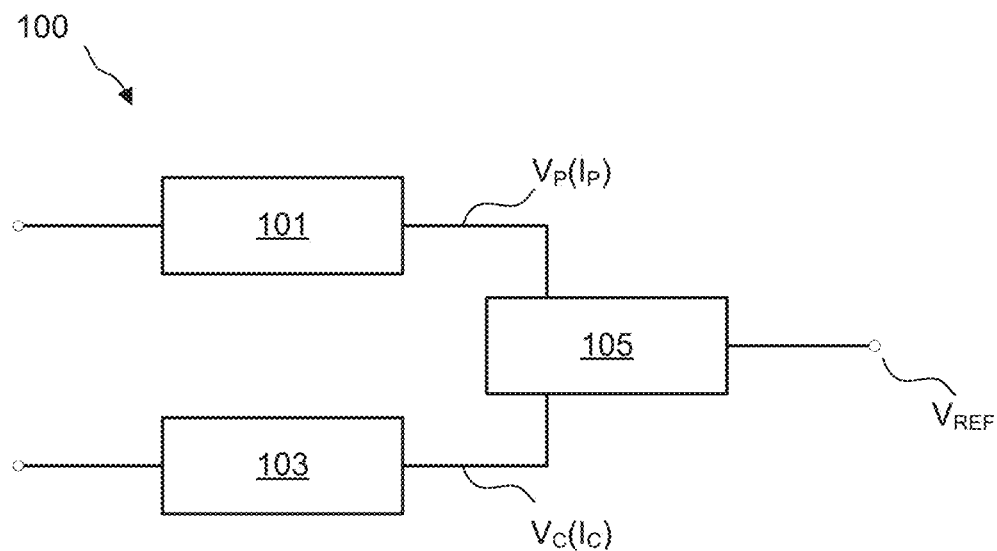
FIG. 1 is a block diagram of an exemplary voltage reference circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures as MOSFETs.

The term "FinFET" refers to a FET that is formed over a fin that is vertically oriented with respect to the planar surface of a wafer.

S/D refers to the source and/or drain junctions that form two of the four terminals of a FET.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

Various embodiments in accordance with this disclosure relate generally to IC (integrated circuit) devices, and more specifically, provide circuits and methods of producing circuits for process-invariant and temperature-independent voltage reference circuits in low-voltage applications. High temperature generally changes the characteristics of IC devices in ways that adversely impact their operating speed and reliability, therefore low-cost and temperature-independent devices are desired, particularly for modern portable and IoT (Internet-of-things) devices. IoT devices are usually untethered and require components with low power consumption. Sensing devices for IoT applications such as pressure, temperature, or humidity sensors, use ADC (analog-to-digital converter) and DAC (digital-to-analog converter) components that are temperature-independent and operate under low bias voltage. Voltage reference circuits in accordance with this disclosure are integral and vital parts for the above-mentioned low-power IoT applications, or power supply systems, such as low dropout (LDO) regulators.

Exemplary temperature compensation circuits in accordance with this disclosure incorporate dual work function layers into FET gate stacks to adjust their threshold voltages. One benefit of incorporating dual work function layers is that a voltage reference circuit made with such FETs is capable of producing highly-accurate and temperature-independent output voltages with a wide current range. A benefit of voltage reference circuits in accordance with this disclosure is that the voltage reference circuits can be used in low-voltage applications, such as but not limited to, sub-0.5V bias voltage circuits or thermal sensors. Further, it is cost-effective to incorporate dual work function layers into the FETs used in voltage reference circuits, and these circuits exhibit reduced sensitivity to manufacturing process variation.

Before describing exemplary embodiments related to voltage reference circuits, an example of integrated circuit design management is presented. As demands of consolidating functions and applications from printed circuit board to a single chip are growing stronger, scales and designs of ICs become increasingly complex and time consuming. Computer-Aided Design (CAD) has become a necessary tool to speed up and improve the quality of IC design. Of all the phases in designing an application specific integrated circuit (ASIC), physical layout takes up a major portion of the design cycle.

In creating a physical layout of an ASIC, a computer layout may be first generated. Generally, the computer layout may be created by arranging a number of individual blocks or "logic cells" based on designated schematics. The functionality and design of individual logic cells may be predetermined and stored on a computer system as a standardized cell design. Such cell design techniques can save time in the design cycle, as it may be no longer necessary for an IC designer to custom design each individual gate and transistor in an integrated circuit. Rather, the circuit or device designer breaks down a new circuit or device design into a number of known (or new) cell designs and then combines these cells appropriately to generate a circuit or device that performs a desired function. Each of the logic cells or devices contains a number of terminals for interconnection with other cells in the IC.

To release the layout to mask making for use in semiconductor processing, the layout data may be transferred to a mask shop. This is called tape-out. Tape-out represents a stage when a design layout database for an IC is ready to be transferred to a mask-making operation. To prepare a layout database for tape-out, commercial place-and-route CAD tools are used. More particularly, place-and-route CAD programs are used to 1) arrange logic cells and other elements to optimize their interconnections and the overall size of an IC; and 2) define the routing region and to select channels to connect the logic cells and elements. A place-and-route CAD tool requires as input a predetermined number of predefined logic cell types (e.g., Inverter, NAND, NOR, XOR, Multiplexer, flip-flop, Decap, etc.) to implement the tasks mentioned above. In response, the place-and-route CAD tool outputs a layout database.

Using the layout database as a blueprint for photolithography masks, a number of basic transistor layers, contact, and metal layers defining the elements and interconnections of the IC are created in substrates through a combination of semiconductor processes namely depositing, masking, and etching. When combined, these layers form the IC and physically implement the desired functions. Examples of elements and interconnections of the IC are, but not limited to, FinFETs, planar FETs, and multi-layer interconnects (MLIs). Depending on the complexity of the ASIC, each circuit may involve multiple basic layers, multiple contacts, and multiple metal layers. This layout database release procedure is widely known as tape-out.

FIG. 1 is a block diagram of an exemplary voltage reference circuit. Voltage reference circuits in accordance with this disclosure produce nominally temperature-independent voltage outputs by offsetting temperature-change-induced output variations. A voltage reference circuit 100 may comprise a first voltage source 101, a second voltage source 103, and a voltage output subcircuit 105. Voltage reference circuit 100 may include various other devices and features, such as additional transistors, bipolar junction transistors, resistors, capacitors, diodes, fuses, etc., but is simplified for a better understanding of the present disclosure.

Voltage reference circuit 100 is a nominally temperature-independent voltage reference circuit, in which the positive temperature dependency of first voltage source 101 is cancelled by the negative temperature dependency of second voltage source 103, thus resulting in a stable output voltage $V_{REF}$ at a reference temperature. In this embodiment, first voltage source 101 is a proportional-to-absolute-temperature (PTAT) circuit with a positive temperature dependency. In a PTAT circuit, the variation in its output voltage is proportional to temperature, i.e., increasing and decreasing as temperature increases and decreases, respectively. In this embodiment, second voltage source 103 is a complementary-to-absolute-temperature (CTAT) circuit with a negative temperature dependency. In a CTAT circuit the variation in its output voltage is complementary to temperature i.e., decreasing and increasing as temperature increases and decreases, respectively. In operation, the PTAT circuit generates output voltage $V_P$ and current $I_P$, and the CTAT circuit generates output voltage $V_C$ and current $I_C$. Output currents generated by CTAT and PTAT circuits are summed by voltage output module 105 to generate a reference voltage $V_{REF}$. Depending on the circuit topology, output voltages generated by CTAT and PTAT circuits may alternatively be summed by voltage output module 105 to generate the reference voltage $V_{REF}$. Reference voltage $V_{REF}$ is nominally insensitive to changes in temperature or power supply.

Figure 2:
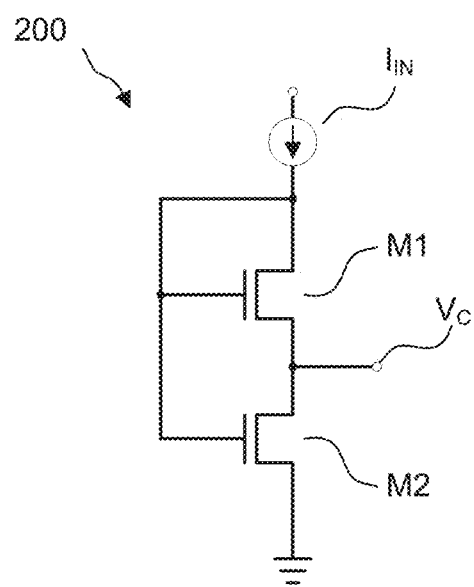
FIG. 2 is a schematic circuit diagram of an exemplary CTAT circuit, in accordance with some embodiments.

FIG. 2 is a schematic diagram of an exemplary embodiment of a CTAT circuit. The exemplary CTAT circuit is a CTAT cell 200 that comprises two NMOS transistors M1 and M2 with terminals connected as shown in FIG. 2. Each transistor comprises at least three terminals: source, drain and gate. As shown FIG. 2, the drain terminal of first transistor M1 is coupled to an input current source $I_{IN}$ and also coupled to gate terminals of both transistors M1 and M2. Source terminal of transistor M1 is coupled to drain terminal of transistor M2 to provide output voltage $V_C$. Source terminal of transistor M2 is coupled to ground. CTAT cell 200 may include various other devices and features, such as additional transistors, bipolar junction transistors, resistors, capacitors, diodes, fuses, etc., but is simplified for a better understanding of the present disclosure. Therefore CTAT cell 200 may include a plurality of devices interconnected.

In this exemplary embodiment, transistors M1 and M2 are metal gate n-channel transistors. CTAT cell 200 may comprise a plurality of transistors M1 and a plurality of transistors M2, as needed by circuit performance specification. One process of implementing metal gates is termed a "gate last" or "replacement gate." Such processes include forming a sacrificial polysilicon gate, performing various processes associated with the semiconductor device, and subsequently removing the sacrificial gate and replacing it with a metal gate. Selection of work function materials for the metal gate affects transistor threshold voltage $V_{TH}$. A work function value is associated with the material composition of the work function layer, thus, the material of the work function layer is chosen to tune its work function so that the desired nominal threshold voltage $V_{TH}$ is achieved. Work function metal may be p-type or n-type. For example, an NFET may contain both p-type as well as n-type work function metal and more than one work function layer, or the NFET may contain only one type of work function metal. Exemplary p-type work function materials include, but are not limited to, TiN, TaN, Ru, Mo, WN, $ZrSi_2$, $MoSi_2$, $TaSi_2$, $NiSi_2$, WN. Exemplary n-type work function metals include, but are not limited to, Ti, Ag, Al, TaAl, TaAlC, TiAlN, TaC, TaCN, TaSiN, Mn, Zr. Work function layer may be deposited by CVD (chemical vapor deposition), PVD (physical vapor deposition), ALD (atomic layer deposition) and/or other suitable process.

In exemplary CTAT cell 200, NMOS transistors M1 and M2 include different work function layers to achieve different threshold voltages. For example, the structure of transistor M1 includes an n-type work function layer while transistor M2 includes a p-type work function layer. Transistor threshold voltages are determined by a number of factors, and one factor is the difference between work functions of the gate and the semiconductor material. Different work function materials have different temperature slopes. Since NMOS transistors M1 and M2 are both n-channel devices, incorporating n-type and p-type work function layers leads to different combinations of gate and semiconductor materials. Therefore, the difference between work functions of n-type and p-type work function layers results in different threshold voltages of NMOS transistors M1 and M2. In the exemplary CTAT cell 200, the threshold voltage of NMOS transistor M1 is configured to be lower than the threshold voltage of NMOS transistor M2. Similarly, the difference between work functions of n-type and p-type work function layers results in different threshold voltages if M1 and M2 are PMOS transistors.

As described above, various work function layers can be predetermined and stored as CAD functional blocks, therefore n-type work function layer can be incorporated into transistor M1 layout design by placing the n-type work function metal CAD block into the layout design. Other functional layers such as gates, sources, and drains of device designs can be incorporated into the layout as CAD functional blocks in a similar fashion.

P-type work function layer are incorporated into transistor M2 layout design by using the transistor M1 layout design and replacing the n-type work function metal CAD block with a p-type work function metal CAD block, especially when layouts for transistors M1 and M2 have sufficient similarities in device designs due to performance specifications and circuit design rules. In order to achieve this, transistor M1 layouts and corresponding device layers may be imported into a CAD block library to be used for CAD block library of transistor M2 as a "phantom" view. The phantom view may also include footprints (e.g., physical information of the circuit including locations and specifications of the gates, source and drain regions, interconnections, isolation regions, work function blocks, and the like) and information as to the connections (e.g., pin layouts) of the first device. Necessary CAD blocks for generating transistor M2 layouts are extracted from the CAD block library to be placed and connected to each other or other circuit components according to the performance specifications and circuit design rules. Examples of performance specifications are, but not limited to, a nominal temperature coefficient, specific bias or output voltages, specific bias or output currents, physical limitations, etc.

Alternatively, a plurality of transistor M1 layouts can be first generated where both transistors M1 and M2 are designed to be placed. One or more CAD functional blocks in transistor M1 layouts are then blocked-out using one or more block-out CAD blocks. A block-out CAD block is a blank CAD block from the CAD library used to block out functional CAD blocks and their footprints. The blocked out CAD functional blocks are then replaced with CAD functional blocks from the library, as needed by the performance specifications. For example, n-type work function metal CAD block in transistor M1 layout designs can be blocked out and replaced with p-type work function metal CAD blocks, thus generating transistor M2 layouts with p-type work function layers. Since both n-type and p-type work function metal CAD blocks can be predetermined, no new layers or blocks are necessary. Any appropriate devices for providing a nominal threshold voltage can be used in the voltage reference circuit, such as but not limited to, standard threshold voltage (SVT) layer, ultra-low threshold voltage (uLVT) layer, low threshold voltage (LVT) layer, or high threshold voltage (HVT) layer.

In an alternative process, n-type and p-type work function layers can be incorporated into transistor layout designs in a different manner as compared to the process described above. P-type work function metal CAD block is first placed into the layout design for transistor M2. Then, to incorporate n-type work function metal CAD block into the layout design for transistor M1, p-type work function metal CAD block in the transistor M2 layout is replaced with an n-type work function metal CAD block.

In another alternative process, a plurality of transistor M2 layouts with p-type work function metal CAD blocks can be first generated where both transistors M1 and M2 are designed to be placed. P-type work function metal CAD blocks in transistor M2 layout designs are blocked out and replaced with n-type work function metal CAD blocks, thus generating transistor M1 layouts with n-type work function layers. Since both n-type and p-type work function metal CAD blocks can be predetermined, no new layers or blocks are necessary.

The processes mentioned above provides the benefit that the CTAT cell is insensitive to manufacturing process variations since no additional or new device/process layers are needed.

The output voltage $V_C$ of CTAT cell 200 follows Equation 1 below:

$$V_C = Vgs_{M2} - Vgs_{M1} \sim Vth_{M2} - Vth_{M1} \qquad (1)$$

where $Vgs_{M1}$ and $Vgs_{M2}$ are respective gate to source voltages of transistors M1 and M2, and $Vth_{M1}$ and $Vth_{M2}$ are respective threshold voltages of transistors M1 and M2. $Vth_{M2}$ is configured to be greater than $Vth_{M1}$. The work function layers are selected such that the voltage reference circuit is capable of functioning under sub-0.5V bias voltages, for example, 0.3V.

Methods in accordance with this disclosure provide voltage reference circuits with tunable linear temperature coefficients. By adjusting effective gate widths and lengths of transistors M1 and M2, a nominal temperature coefficient can be achieved that provides linear voltage output over temperature. Although exemplary devices below are illustrated as modifying effective gate widths and lengths, other aspects of the gate structures or features of a semiconductor device may be similarly modified, for example, gate height.

Methods in accordance with this disclosure may be implemented to adjust the effective gate widths and lengths of CMOS devices. However, one may recognize other semiconductor device types may benefit from the present method, such as and not limited to, planar FETs and Fin-FETs. To better illustrate various structures and features of the semiconductor devices, such as gate width, length, or height, an exemplary semiconductor device structure 300 is illustrated in FIG. 3.

Figure 3:
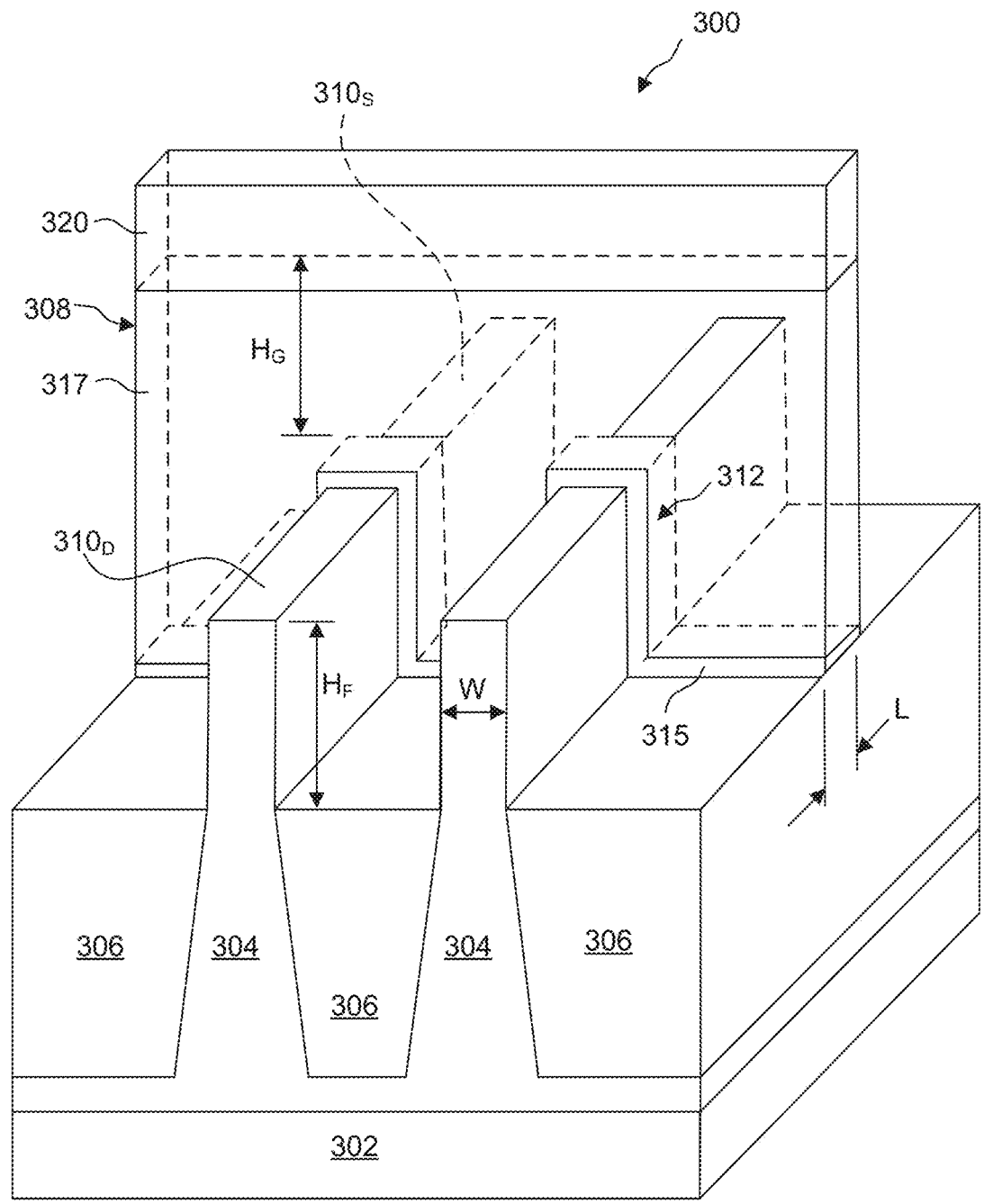
FIG. 3 is an perspective view of a semiconductor device structure that includes FinFET device structures, in accordance with some embodiments.

FIG. 3 is a perspective view of semiconductor device structure 300 that includes FinFET device structures. It should be understood that FIG. 3 is representative only and not intended to be limiting.

Semiconductor device structure 300 includes a substrate 302, a plurality of fins 304, a plurality of isolation structures 306, and a gate structure 308 that is disposed over the sidewalls and top surface of each of fins 304. Gate structure 308 includes a gate dielectric layer 315, and a gate electrode layer 317. In alternative embodiments, one or more additional layers may be included in gate structure 308. FIG. 3 shows a hard mask 320 disposed on a top surface of gate electrode layer 317. Hard mask 320 is used to pattern, such as by etching, gate structure 308. In some embodiments, hard mask 320 is made of a dielectric material, such as silicon oxide. The perspective view of FIG. 3 is taken after the patterning process (e.g., etching) of gate structure 308. FIG. 3 shows only one gate structure 308. Those skilled in the art will understand that typical integrated circuits contain a plurality of such, and similar, gate structure(s).

Each of the plurality of fins 304 shown in FIG. 3 includes a pair of S/D terminals. For ease of description, a first one of the pair of S/D terminals is referred to as a source region $310_S$ and a second one of the pair of S/D terminals is referred to as a drain region $310_D$, where S/D terminals are formed in, on, and/or surrounding fin 304. A channel region 312 of fin 304 underlies gate structure 308. Gate structure 308 has a gate length L, and an effective gate width $W_E = 2 \times H_F + W$, as shown in FIG. 3. In some embodiments, the gate length L is in a range from about 10 nm to about 30 nm. In some other embodiments, the gate length L is in a range from about 3 nm to about 10 nm. In some embodiments, the fin width W is in a range from about 10 nm to about 20 nm. In some other embodiments, the fin width W is in a range from about 3 nm to about 10 nm. Gate height $H_G$ of gate structure 308, measured from the top of fin 304 to the top of gate structure 308, is in a range from about 50 nm to about 80 nm, in some embodiments. Fin height $H_F$ of fin 304, measured from the surface of isolation structure 306 to the top of fin 304, is in a range from about 25 nm to about 35 nm, in some embodiments.

Substrate 302 may be a silicon substrate. Alternatively, substrate 302 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 302 is a semiconductor on insulator (SOI).

Isolation structures 306 are made of a dielectric material and may be formed of silicon oxide, silicon nitride, silicon oxynitride, fluorine-doped silicate glass (FSG), a low-k dielectric material, and/or other suitable insulating material. Isolation structures 306 may be shallow trench isolation (STI) structures. In an embodiment, the isolation structures are STI structures and are formed by etching trenches in substrate 302. The trenches may then be filled with insulating material, followed by a chemical mechanical polish (CMP). Other fabrication techniques for isolation structures 306 and/or fin 304 are possible. Isolation structures 306 may include a multi-layer structure, for example, having one or more liner layers.

Fins 304 are active regions where one or more transistors are formed. Fin 304 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 304 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into isolation structures 306, leaving protruding fins. The recesses may be etched using reactive ion etch (RIE) and/or other suitable processes. Numerous other methods to form fins 304 on substrate 302 may be suitable.

Gate structure 308 may include a gate dielectric layer 315, a gate electrode layer 317, a spacer layer 316, and/or one or more additional layers. For ease of description, spacer layer 316 is not shown in FIG. 3. In an embodiment, gate structure 308 uses polysilicon as gate electrode layer 317. Also shown in FIG. 3 is a hard mask 320 disposed on a top surface of gate electrode layer 317. Hard mask 320 is used to pattern, such as by etching, gate structure 308. In some embodiments, hard mask 320 is made of a dielectric material, such as silicon oxide.

Although the perspective view of FIG. 3 shows gate structure 308 using polysilicon as the gate electrode layer 317, those skilled in the art will understand that gate structure 308 may be a sacrificial gate structure such as formed in a replacement gate process used to form a metal gate structure. The replacement gate process and many other steps may be performed and are not shown in these figures. The metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as a silicon oxide layer ($SiO_2$) or silicon oxynitride (SiON). The interfacial dielectric layer may be formed by chemical oxidation, thermal oxidation, ALD, CVD, PVD and/or other suitable formation process.

As mentioned above, exemplary p-type work function metals that may be included in the metal gate structure include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals that may be included in the metal gate structure include Ti, Ag, TaAl, TaAlC, TiAlN, TaC, TaCN, TaSiN, Mn, Zr, other suitable n-type work function materials, or combinations thereof. The work function layer(s) may be deposited by CVD, PVD, and/or other suitable process.

The fill metal layer may include Al, W, or Cu and/or other suitable materials. The fill metal may be formed by CVD, PVD, plating, and/or other suitable processes. The fill metal may be deposited over the work function layer(s), and thereby filling in the remaining portion of the trenches or openings formed by the removal of the sacrificial gate structure.

As mentioned above, by adjusting effective gate widths $W_E$ and lengths L of transistors M1 and M2, a nominal temperature coefficient can be achieved with linear output voltage change over temperature. For better illustration, the device dimension ratio is defined as the ratio between $W_E$ and L, therefore the device dimension ratios for transistors M1 and M2 are defined as $P=W_E/L_1$ and $Q=W_E/L_2$, respectively. With the effect of dimension ratio adjustments, a new term is added to Equation 1 to reflect the output voltage $V_C$ of CTAT cell 200:

$$V_C = Vth_{M2} - Vth_{M1} + \eta * V_T * \ln P/Q \qquad (2).$$

$V_T = kT/q$ is the thermal voltage, where k is the Boltzmann constant, T is the absolute temperature, and q is electron charge ($1.6 \times 10^{-19}$ coulomb). η is the sub-threshold slope and typically is a constant. Temperature coefficients of voltage reference circuits are defined as the slope of $V_C$ plotted with respect to temperature T. As shown in Equation 2 and discussed further with respect to FIG. 4, temperature coefficients can be adjusted by dimension ratios P/Q of M1 and M2. Under the circumstance that P and Q are designed to be equal then Equations 1 and 2 are identical. Dimensions and types of transistors can be selected such that CTAT cell 200 is capable of providing a wide range of currents, for example, 10 nA to 50 μA.

Figure 4:
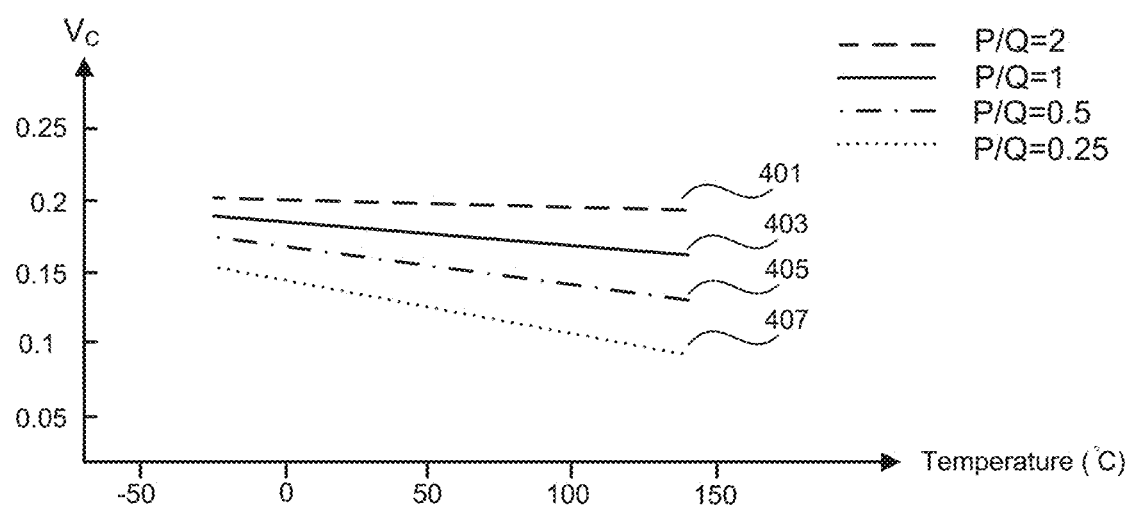
FIG. 4 is an graph of exemplary CTAT cell output voltage $V_C$ plotted with respect to temperature, in accordance with some embodiments.

FIG. 4 depicts an example graph of output voltage $V_C$ of CTAT cell 200 as a function of temperature. As shown in FIG. 4, curves 401, 403, 405 and 407 are chosen to be shown here among a plurality of plots, with curves plotted for $V_C$ with respect to temperature for dimension ratios P/Q of 2, 1, 0.5, and 0.25, respectively. It should be noted that these output voltages, dimension ratios, and resulting curves are selected only as examples and should not be considered as limiting. Using curves 401, 403, 405 and 407 as examples, variation in dimension ratios P/Q changes the slope of the curve accordingly, with curve 401 exhibiting a negative temperature coefficient or slope with the lowest absolute value, and curve 407 exhibiting a negative temperature coefficient or slope with the largest absolute value. As a result, a nominal negative temperature coefficient can be achieved by selecting a specific dimension ratio. For example, P/Q can be adjusted to be below or above 1 to increase or decrease temperature coefficients, respectively. Further, as curves 401, 403, 405 and 407 exhibit linear relationships between $V_C$ and a wide range of temperature, it is possible to reliably determine and set a nominal $V_C$ at a specific temperature.

FIGS. 5A-5C depict various exemplary embodiments CTAT cell 200, in accordance with the present disclosure. In these embodiments, transistors M1 and M2 utilize different work function layers to achieve different threshold voltages. And dimension ratios can be selected to achieve a nominal negative temperature coefficient. Various embodiments disclosed with respect to FIGS. 5A-5C are variations of the CTAT cell circuit disclosed above with respect to FIG. 3, and transistors M1 utilize an n-type work function layer while transistors M2 utilize a p-type work function layer.

Similarly, various work function layers can be predetermined and stored as CAD blocks, therefore n-type work function layer can be incorporated into transistors M1 layout design by placing the n-type work function metal CAD block into the layout design. P-type work function layer can be incorporated into transistors M2 layout design by using transistor M1 layout designs and replacing the n-type work function metal CAD block with a p-type work function metal CAD block. The output voltage $V_C$ of CTAT cell 200 follows Equations 1 and 2 above. As shown in various embodiments with respect to FIGS. 5A and 5C, transistors M1 and M2 may be p-channel transistors.

Figure 6:
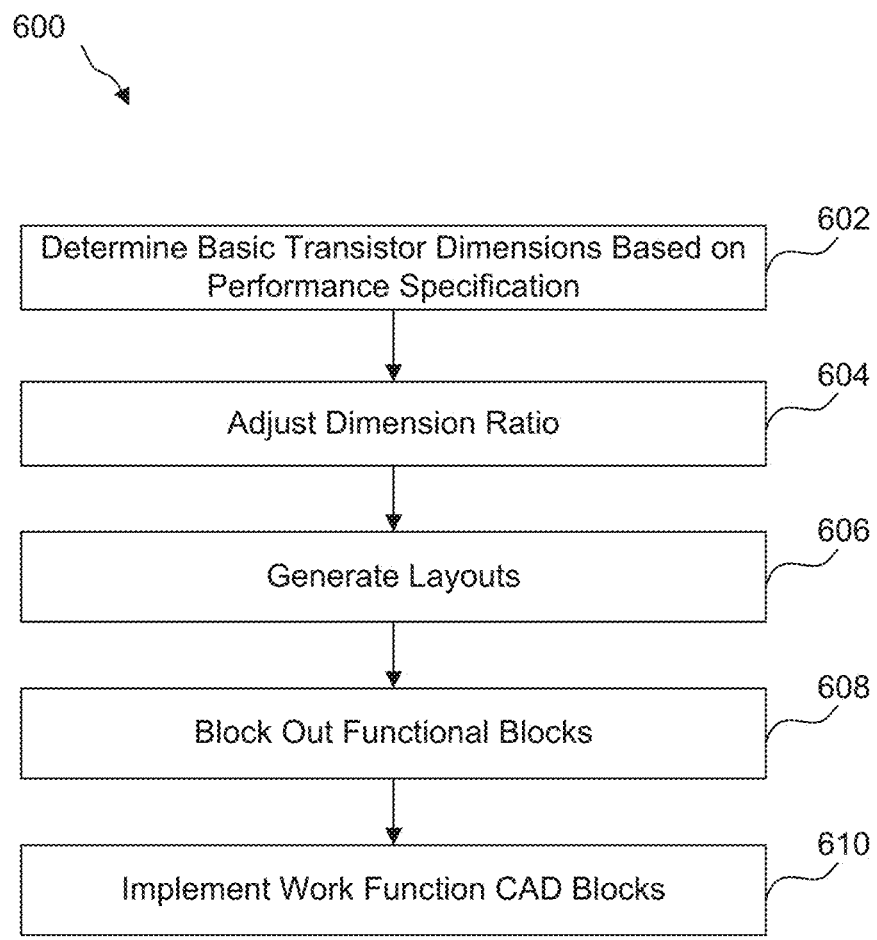
FIG. 6 is a flow diagram of an illustrative method for producing CTAT cell layout designs, in accordance with some embodiments.

FIG. 6 is a flow diagram of an illustrative method 600 for producing CTAT cell layouts. Other operations may be performed between various operations of method 600.

Method 600 begins with operation 602, where a performance specification is determined for the CTAT cell layout and basic transistor dimensions are determined based on the performance specification. For example, CTAT cell specifications are determined based on certain current or voltage output requirements. The CTAT cell may comprise a plurality of transistors, for example, a first FET and a second FET. By adjusting basic transistor dimensions such as effective gate widths $W_E$ and lengths L of the first and second FETs, a nominal temperature coefficient with linear output voltage change over temperature can be achieved.

Method 600 continues with operation 604, where dimension ratios P and Q for the first and second FETs, respectively, are adjusted to achieve a nominal negative temperature coefficient. For example, P/Q can be adjusted to be below or above 1 to increase or decrease temperature coefficients, respectively. Therefore, a performance specification regarding temperature coefficient for CTAT cells may be provided for the first and second FETs that are to be included in the CTAT cell layouts. Automated software tools are used to transform the specification into a specific circuit structure, for example, as provided in a netlist. By adjusting dimension ratios of the first and second FETs, a nominal temperature coefficient with linear output voltage change over temperature can be achieved.

Method 600 continues with operation 606 where layouts for CTAT cells are generated. Tools (CAD tools) are used to convert the netlist into a layout of FETs. The layout may be provided in a GDS II format, or other layout format known in the art. In an embodiment, layout for the first FET may be generated from a pre-determined netlist or library, for example, implementing a pre-determined n-type work function layer. In contrast to conventional methods however, layout for the second FET is performed taking into account the layout of the first FET.

Method 600 continues with operation 608, where one or more CAD functional blocks in the layouts of the first and second FETs are blocked-out using block-out CAD blocks. For example, work function metal CAD blocks in the layouts of the first and second FETs are blocked out using block-out CAD blocks. Alternatively, work function metal CAD blocks are blocked out only for selected device layouts.

Method 600 continues with operation 610, where work function metal CAD blocks are implemented for selected devices. The layout of a specific layer of selected devices may be imported from the library. For example, work function metal CAD block of the second FET is formed by replacing the n-type work function metal CAD block in the phantom view with an p-type work function metal CAD block. This operation is done by first removing the n-type work function metal CAD block from the phantom view and then importing p-type work function metal CAD block from the netlist or library into the place of the removed n-type work function metal CAD block to generate a layout of the second FET. Alternatively, a plurality of first device layouts can be first generated where both first and second devices are designed to be placed. One or more CAD functional blocks in first device layouts are then blocked-out using a block-out CAD block. Other CAD functional blocks are extracted from the library and placed at the location of the blocked out CAD functional blocks, as needed by the performance specifications. Since CAD functional blocks can be predetermined, no new layers or blocks are necessary. Any appropriate work function metal CAD blocks for work function metal layers can be used, such as but not limited to, standard threshold voltage (SVT) layer, ultra-low threshold voltage (uLVT) layer, low threshold voltage (LVT) layer, or high threshold voltage (HVT) layer. These processes provide the benefit that the CTAT cell is insensitive to manufacturing process variation since no additional or new device/process layers are needed.

Figure 7:
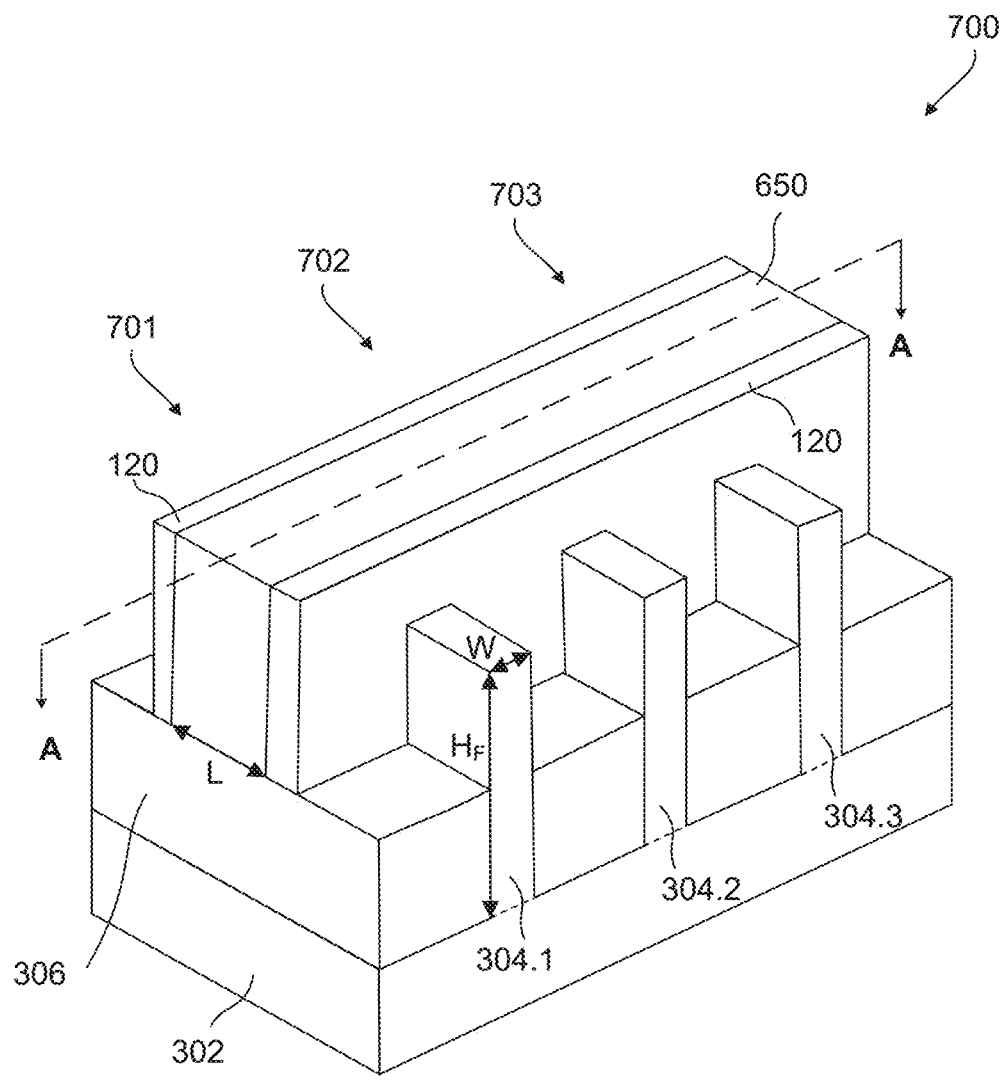
FIG. 7 is a perspective view of a group of partially fabricated FinFETs formed on a substrate.
Figure 8A:
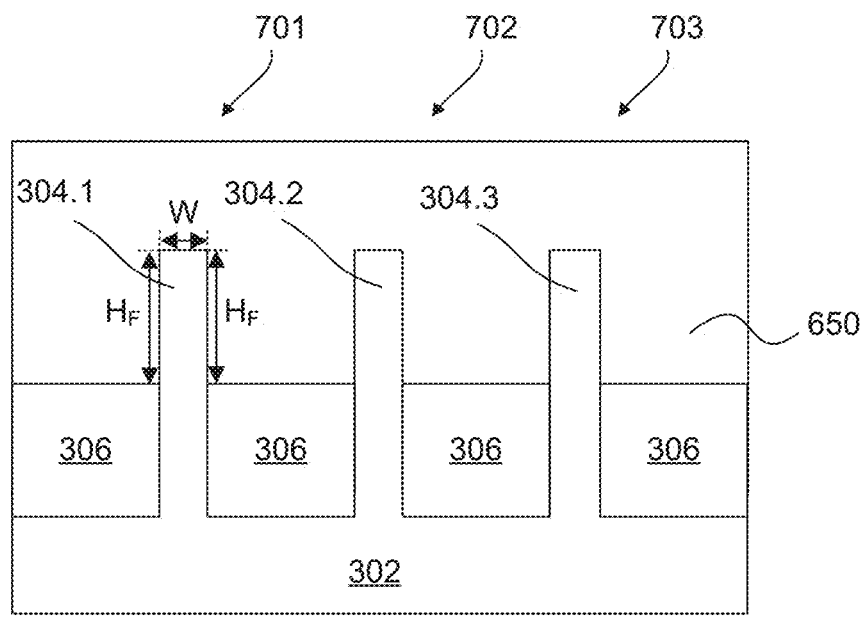
FIGS. 8A-8F show various stages of an exemplary dual work function layer gate replacement process.
Figure 8B:
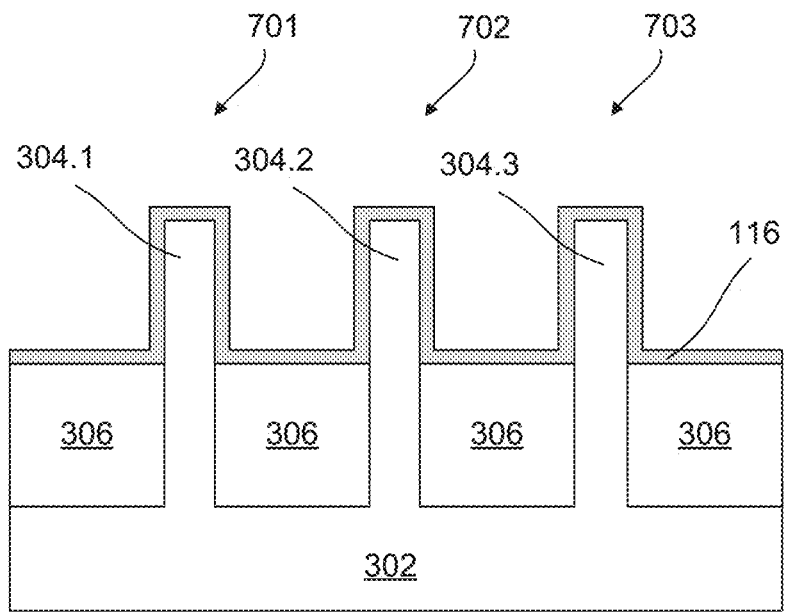
Figure 8C:
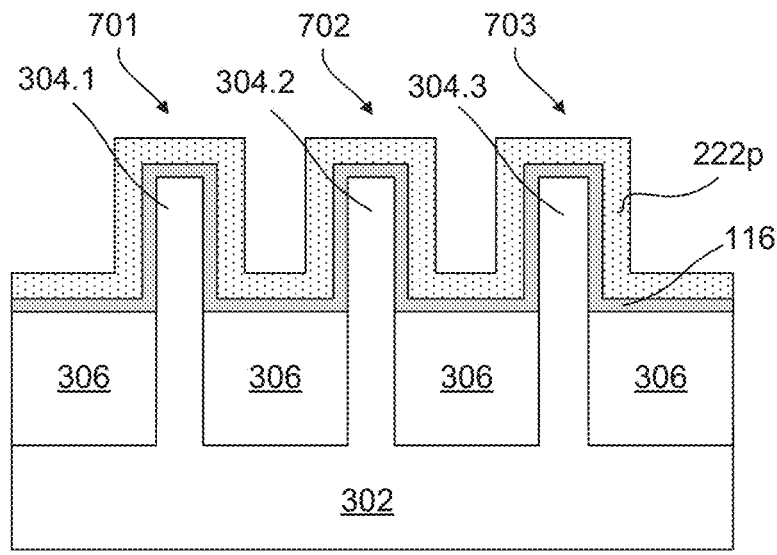
Figure 8D:
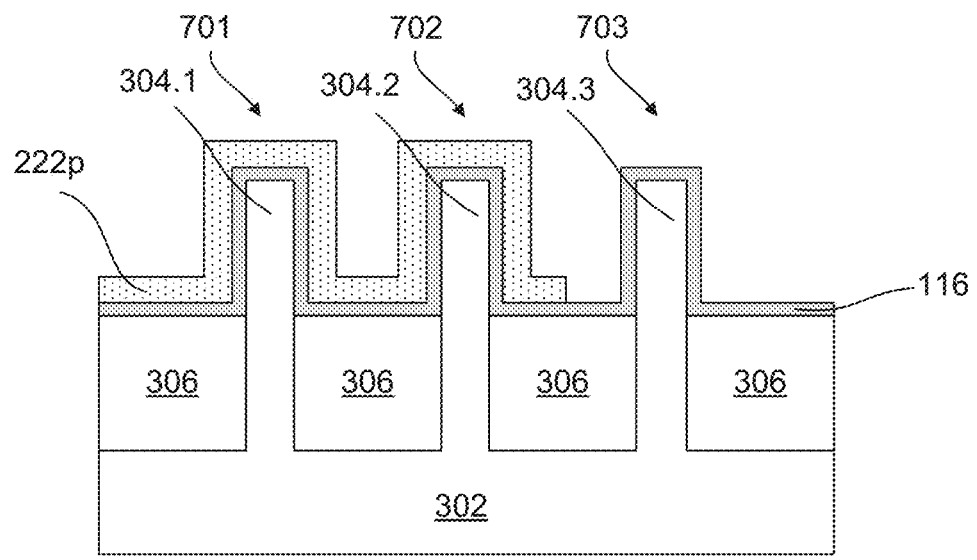
Figure 8E:
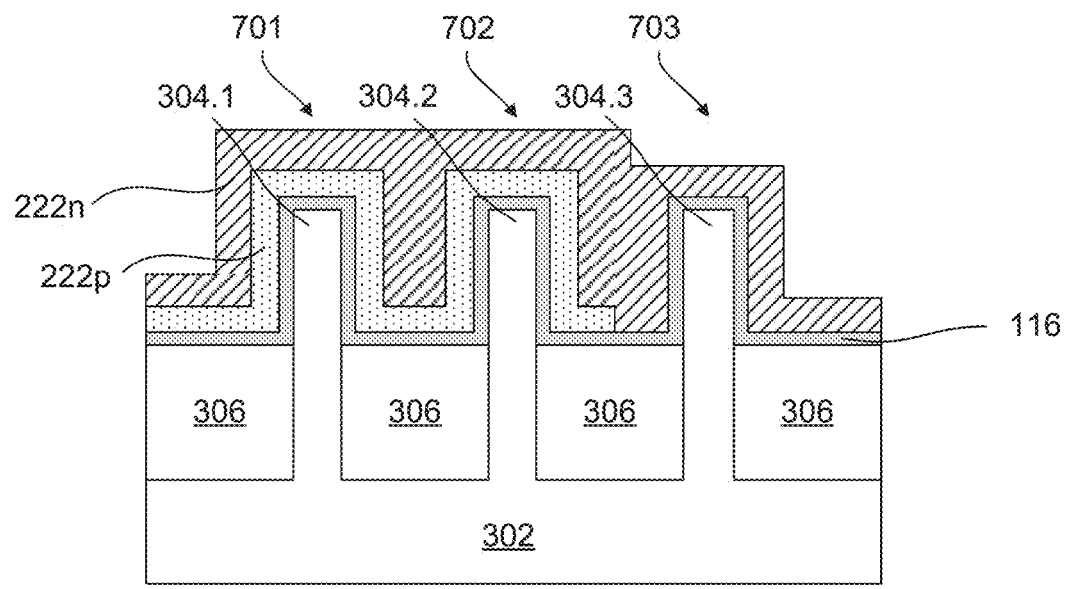
Figure 8F:
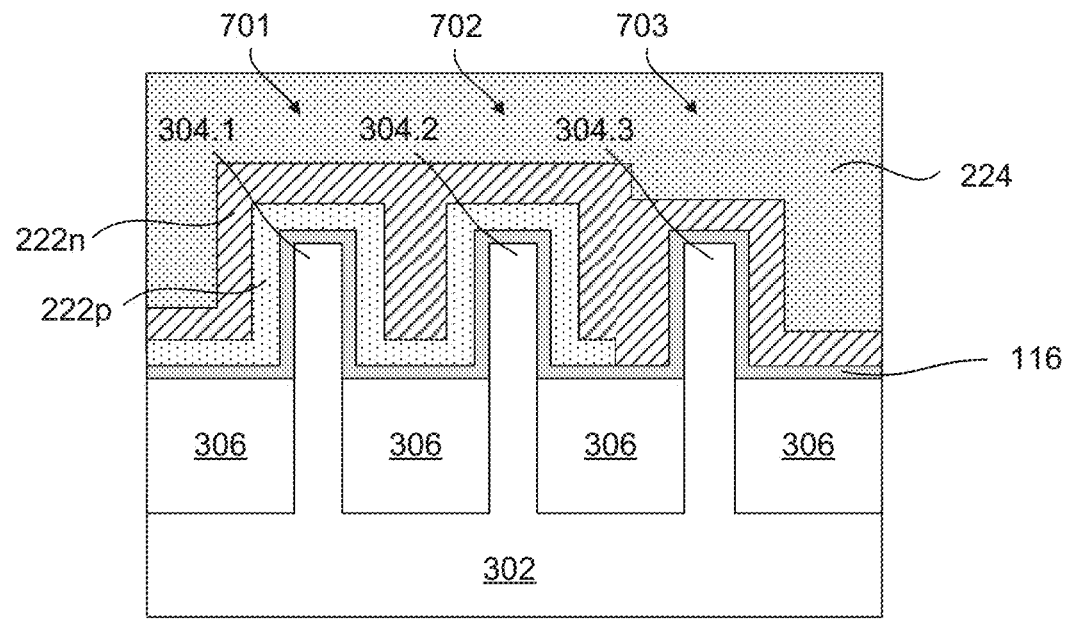

FIG. 7-8F illustrate an exemplary fabrication process flow and structures of a CTAT cell in a typical metal gate replacement FinFET process. Solely for illustrative purposes, the fabricated structures illustrated in FIGS. 7-8F can be produced in a different order or not produced depending on specific applications. It should be noted that partially fabricated FinFETs 700 do not represent a completed CTAT cell. Other fabrication structures may be included or omitted for FinFETs 700, and are not described here merely for clarity.

FIG. 7 is a perspective view of a group of partially fabricated FinFETs 700 formed on substrate 302, including n-channel FinFETs 701 through 703. FinFETs 700 may also include p-channel FinFETs. FinFETs 700 are variations of semiconductor device structure 300 described above with reference to FIG. 3. Patterned polysilicon structure 650 and spacers 120 are formed on fins 304.1 through 304.3. Patterned polysilicon structure 650 and spacers 120 are formed to wrap around portions of the fin structure that are above STI regions 306. Channel regions of fins 304.1 through 304.3 underlies polysilicon structure 650. Polysilicon gate structure 650 has a gate length L, and an effective gate width $W_E = 2 \times H_F + W$, as shown in FIG. 7. Patterned polysilicon structure 650 is formed by any suitable process or processes. For example, patterned polysilicon structure 650 can be formed by a procedure including deposition, photolithography patterning, and etching processes. The deposition processes include CVD, PVD, ALD, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). Spacers 120 may include dielectric material such as silicon oxide, silicon carbide, silicon nitride, silicon oxy-nitride, or other suitable material. Spacers 120 may comprise a single layer or multilayer structure. A blanket layer of a dielectric material may be formed over patterned polysilicon structure 650 by CVD, PVD, ALD, or other suitable technique followed by an anisotropic etching on the dielectric material to form spacers 120 on two sides of patterned polysilicon structure 650.

FIG. 8A is a cross-sectional view of the group of partially fabricated FinFETs 700 in FIG. 7 along lines A-A. Patterned polysilicon structure 650 is disposed on top surfaces of STI regions 306 and is wrapped around portions of fins 304.1 through 304.3 that protrude above STI regions 306, as illustrated in FIG. 8A. The fins have an effective gate width $W_E = 2 \times H_F + W$, as shown in FIG. 8A.

FIGS. 8B-8F show various stages of an exemplary dual work function gate replacement process for the group of FinFETs 700. FIG. 8B shows a cross-sectional view of FinFETs 700 along lines A-A after removal of a portion of patterned polysilicon structure 650 followed by deposition of dielectric layer 116, according to some embodiments. Patterned polysilicon structure 650 may be removed by a dry etching process such as reactive ion etching (RIE). The gas etchants used in etching of polysilicon 650 may include chlorine, fluorine, bromine, and/or combinations thereof. FIG. 8B illustrates that dielectric layer 116 is disposed on top surfaces of STI regions 306 and is wrapped around upper portions of fins 304.1 through 304.3. Dielectric layer 116 may include one or more layers of silicon oxide, silicon nitride, silicon oxy-nitride, or high-k dielectric materials such as hafnium oxide ($HfO_2$), $TiO_2$, $HfZrO$, $Ta_2O_3$, $HfSiO_4$, $ZrO_2$, $ZrSiO_2$, or combinations thereof. Dielectric layer 116 may be formed by CVD, ALD, PVD, e-beam evaporation, or other suitable process. Alternatively, high-k dielectric materials may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods.

FIG. 8C shows a cross-sectional view of the structure of FIG. 8B after deposition of p-type gate work function layer 222p. P-type gate work function layer 222p is disposed on dielectric layer 116 across fins 304.1 through 304.3. Exemplary p-type work function materials include, but are not limited to, TiN, TaN, Ru, Mo, WN, $ZrSi_2$, $MoSi_2$, $TaSi_2$, $NiSi_2$, WN. The one or more materials included in gate work function layer 222p may be formed using a suitable process such as ALD, CVD, PVD, plating, or combinations thereof.

FIG. 8D shows a cross-sectional view of the structure of FIG. 8C after removal of a portion of p-type gate work function layer 222p. P-type gate work function layer 222p is patterned using a masking element (not shown in figures), such that the portion of p-type gate work function layer 222p that is disposed over FinFETs 701 and 702 is protected by the masking element during the etching process, while the portion of p-type gate work function layer 222p over FinFET 703 is exposed.

The masking element may include photoresist, hard mask, and/or other suitable materials. An exemplary hard mask material is spin-on glass (SOG). In embodiments, the masking element may include ceramic, spin-on or chemical/physical deposition polymer, low melting point ceramic. The masking element may be formed by deposition of photoresist (e.g., spin-on) and photolithography processes to pattern the deposited photoresist including exposure, bake, development, and further bake and cleaning processes.

P-type gate work function layer 222p may be removed by dry etch and/or wet etch processes. Exemplary etches include a fluorine/chlorine based dry etch, an HCl wet etch, an $NH_4OH$ solution wet etch, and/or other suitable etchants.

The masking element may then be removed by suitable processes after the etching of the work function layer. Removal processes include wet etch, dry etch, stripping, and/or other suitable processes.

FIG. 8E shows a cross-sectional view of the structure in FIG. 8D after deposition of n-type gate work function layer 222n. N-type gate work function layer 222n is disposed on dielectric layer 116 across FinFET 703, and also on the remaining p-type gate work function layer 222p. Alternatively, n-type gate work function layer 222n may be formed only on the exposed dielectric layer, and not on the remaining p-type gate work function layer 222p. As discussed above, exemplary n-type work function metals include, but are not limited to, Ti, Ag, Al, TaAl, TaAlC, TiAlN, TaC, TaCN, TaSiN, Mn, Zr. The one or more materials included in gate work function layer 222n may be formed using a suitable process such as ALD, CVD, PVD, plating, or combinations thereof.

FIG. 8F shows cross-sectional view of the structure in FIG. 8E after deposition of gate metal fill layer 224. Gate metal fill layer 224 is disposed on n-type gate work function layer 222n and may include a single metal layer or a stack of metal layers. The stack of metal layers may include metals different from each other. In some embodiments, gate metal fill layer 224 includes any suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate metal fill layer 224 may be formed by ALD, PVD, CVD, or other suitable conductive material deposition process. In an embodiment, gate metal fill layer 224 includes W film formed by ALD or CVD. The W film may include fluorine in the form of fluoride ions introduced from a fluorine-based precursor (e.g., tungsten hexafluoride ($WF_6$)) used during the W film deposition process. In another embodiment, gate metal fill layer 224 includes Al or Co film formed by ALD or CVD. Gate metal fill layer 224 may then be planarized by chemical mechanical polishing (CMP).

Figure 9:
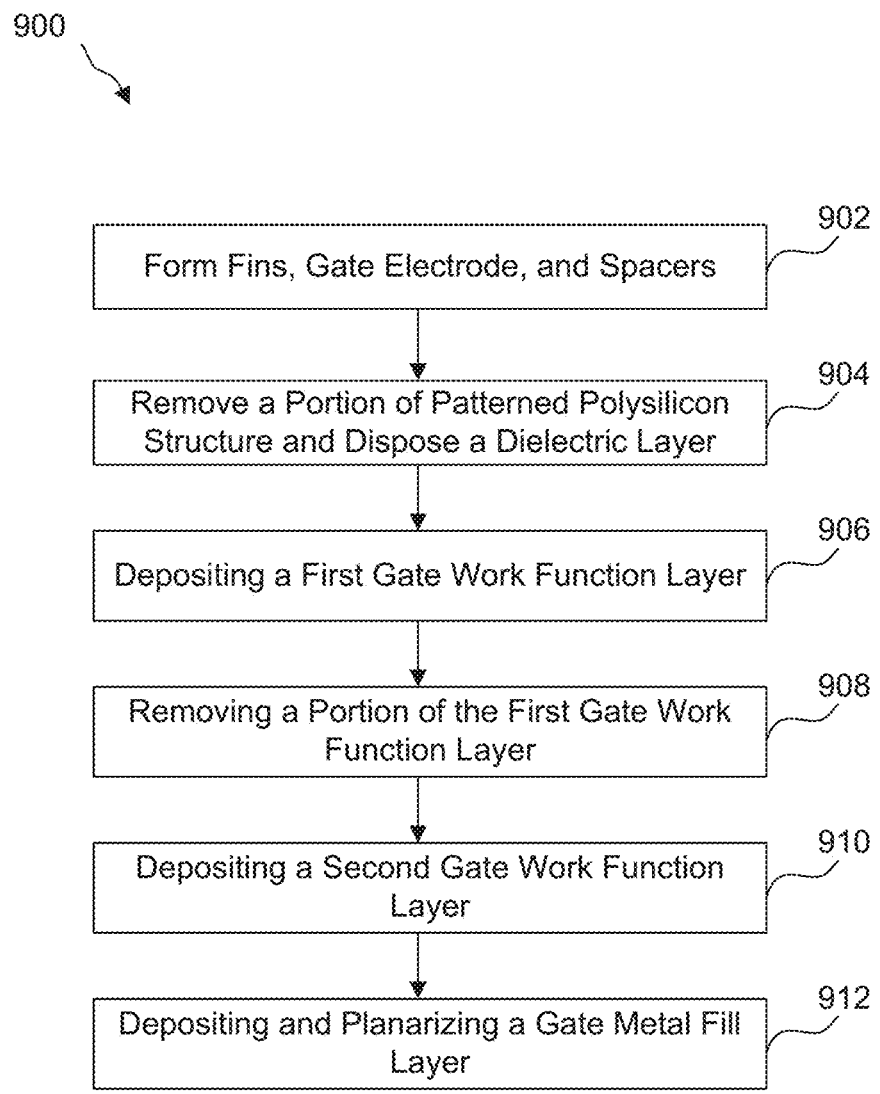
FIG. 9 is a flow diagram of an illustrative method for producing CTAT cell with dual work function layers.

FIG. 9 is a flow diagram of illustrative method 900, using FinFET structures as an example to produce CTAT cell with dual work function layers. Solely for illustrative purposes, the operations illustrated in FIG. 9 will be described with reference to the example fabrication structures illustrated in FIGS. 7-8F. Operations can be performed in a different order or not performed depending on specific applications. It should be noted that method 900 does not produce a completed CTAT cell. Other fabrication steps may be performed or omitted between the various steps of method 900, and are not described here merely for clarity.

Method 900 begins with operation 902, patterning a semiconductor substrate to form fins, forming sacrificial gate electrodes, and sidewall spacers. Fins are vertical, i.e., nominally perpendicular to a surface of the substrate, and may be rectangular or trapezoidal in shape. Fins may be formed using a variety of dry etch techniques such as reactive ion etching or inductively coupled plasma etching.

A sacrificial gate electrode is formed on the fin, the sacrificial gate electrode may be polysilicon. Forming the sacrificial gate electrode includes depositing and patterning a polysilicon structure through photolithography processes such that the patterned polysilicon structure is formed over designated fin surfaces. The gate electrode may also include a stack of various metal or metal alloy layers.

Sidewall spacers are formed adjacent to both sidewalls of the gate stacks. The sidewall spacers are typically formed at the same time by an etch-back process. In alternative embodiments the sidewall spacers may be formed of two or more layers of material.

Method 900 continues with operation 904, removing a portion of patterned polysilicon structure and disposing a dielectric layer at least in a portion of the regions from which the portion of the patterned polysilicon structure, i.e., the sacrificial gate electrode has been removed. Upper portions of the fins will be exposed at locations where the patterned polysilicon structure is removed. The dimensions of the exposed fins determine the effective gate widths $W_E$ of the channel regions in later formed FinFETs. As discussed above, by selecting transistor dimensions, a nominal temperature coefficient can be achieved with linear output voltage change over temperature.

Dielectric layer is disposed on top surfaces of STI regions and on protruding upper portions of fins. The dielectric layer may include one or more layers of silicon oxide, silicon nitride, silicon oxy-nitride, or high-k dielectric materials such as hafnium oxide ($HfO_2$), $TiO_2$, HfZrO, $Ta_2O_3$, $HfSiO_4$, $ZrO_2$, $ZrSiO_2$, or combinations thereof. Dielectric layer 116 may be formed by CVD, ALD, PVD, e-beam evaporation, or other suitable process. Alternatively, high-k dielectric materials may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The high-k dielectric layer may be formed by ALD and/or other suitable methods.

Method 900 continues with operation 906, depositing a first gate work function layer over the dielectric layer. The one or more materials included in the first gate work function layer may be formed using a suitable process such as ALD, CVD, PVD, plating, or combinations thereof.

Method 900 continues with operation 908, removing a portion of the first gate work function layer. The first gate work function layer is patterned using a masking element, such that a portion of the first gate work function layer is protected and the remaining portion is exposed. The protected portion of the first gate work function layer is selected to become a structural part of FinFETs that have a first threshold voltage. The masking element may include photoresist, hard mask, and/or other suitable materials. The masking element may be formed by deposition and patterned using photolithography processes, including exposure, bake, development, and further bake and cleaning processes. The exposed first gate work function layer may be removed by dry etch and/or wet etch processes. The masking element may then be removed by suitable processes after the etching of the work function layer.

Method 900 continues with operation 910, depositing a second gate work function layer on the dielectric layer and on the remaining first gate work function layer. Alternatively, the second gate work function layer may be formed only on the exposed dielectric layer, and not on the remaining first gate work function layer. This may be achieved by processing the deposited second gate work function metal using photolithography and etching processes. The conductivity type of the first and second gate work function layer are opposite to each other, for example, the conductivity types of first and second gate work function layers are n-type and p-type, respectively. The second gate work function layer is selected to become a structural part of FinFETs that have a second threshold voltage. The first and second threshold voltage are different from each other. The one or more materials included in gate work function layers may be formed using a suitable process such as ALD, CVD, PVD, plating, or combinations thereof.

Method 900 continues with operation 912, depositing and planarizing a gate metal fill layer. A gate metal fill layer is deposited on all exposed gate work function layers. The gate metal fill layer may form on only the second gate work function layer or on both first and second gate work function layers, depending on where the second gate work function layer is formed in operation 908. The gate metal fill layer may include a single metal layer or a stack of metal layers and formed by ALD, PVD, CVD, or other suitable conductive material deposition process. In an embodiment, gate metal fill layer includes W film formed by ALD or CVD. Gate metal fill layer may then be planarized by chemical mechanical polishing (CMP).

Figure 10:
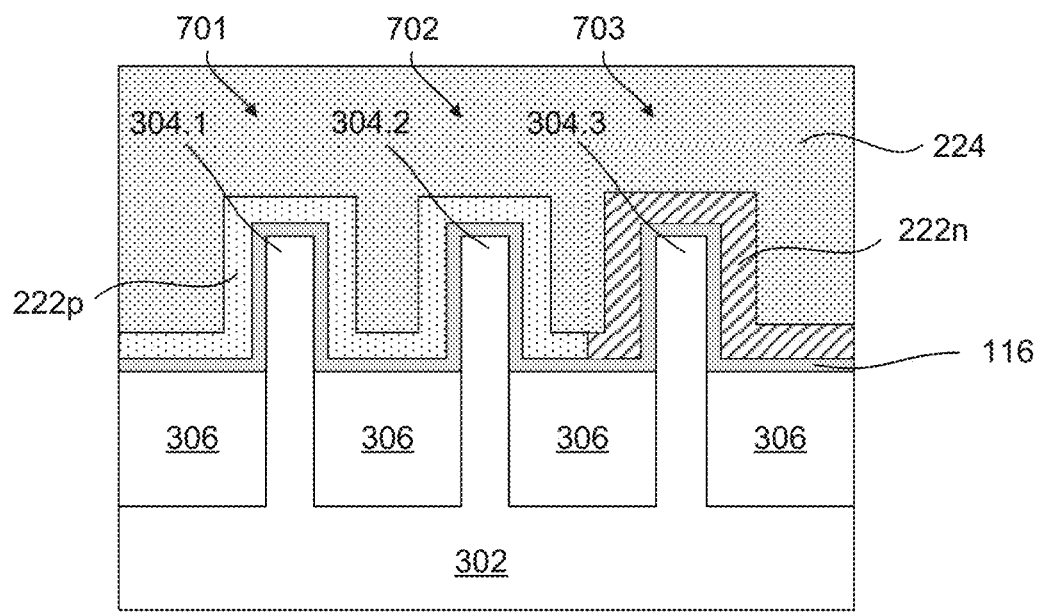
FIG. 10 is a cross-sectional view of an alternative embodiment of the exemplary dual work function layer gate replacement structure.
Figure 11:
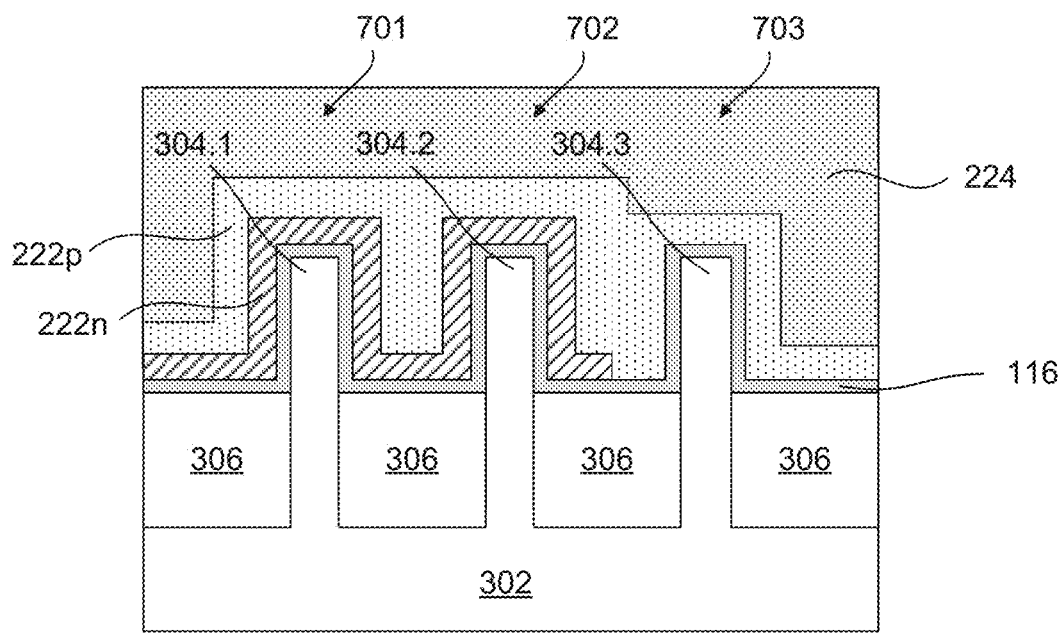
FIG. 11 is a cross-sectional view of a further alternative embodiment of the exemplary dual work function layer gate replacement structure.

FIGS. 10-11 are cross-sectional views of alternative embodiments of the exemplary dual work function layer gate replacement structure.

FIG. 10 is a cross-sectional view of the structure in FIG. 8D after n-type gate work function layer 222n is deposited only on exposed dielectric layer 116. As described above with reference to FIG. 8E, n-type gate work function layer 222n may be formed only on the exposed dielectric layer, and not on the remaining p-type gate work function layer 222p. The n-type work function layer 222n formed on the remaining p-type gate work function layer 222p may be removed via lithography and etch-back processes.

FIG. 11 is a cross-sectional view of another example of dual work function FinFETs used in CTAT cells. Using a process similar to the exemplary dual work function gate replacement process as described with reference to FIGS. 8A-8F, n-type and p-type work function layers 222n and 222p are deposited on the group of FinFETs 700. However, as shown in FIG. 11, n-type work function layer 222n is deposited first and p-type work function layer 222p is formed on the exposed dielectric layer 116. As a result, FinFETs 701 and 702 would comprise dual work function layers while FinFET 703 would comprise a p-type work function layer but not include an n-type work function layer.

Various embodiments in accordance with this disclosure relate generally to integrated circuits, and more specifically, provide circuit designs and fabrication processes of producing circuits and devices for a process-invariant and temperature-independent voltage reference circuits for low-voltage applications.

Exemplary circuits in accordance with this disclosure incorporate dual work function layers into FET gate stacks to set their threshold voltages. One benefit of incorporating dual work function layers is that a voltage reference circuit made with such FETs is capable of producing highly-accurate and temperature-independent output voltages with a wide current range. A benefit of voltage reference circuits in accordance with this disclosure is that the voltage reference circuits can be used in low-voltage applications, such as but not limited to, sub-0.5V bias voltage circuits or thermal sensors. Further, it is cost-effective to incorporate dual work function layers into the FETs used in voltage reference circuits, and these circuits exhibit reduced sensitivity to manufacturing process variation.

In one embodiment, a voltage reference circuit comprises at least a first and a second circuit. The first circuit is configured to produce a first output voltage that increases in magnitude with an increase of temperature and a second circuit includes at least two transistors each with a different threshold voltage and configured to produce a second output voltage that decreases in magnitude with the increase of temperature. A first transistor of the at least two transistors comprises a first gate stack with a first work function material, and a second transistor of the at least two transistors comprises a second gate stack with a second work function material different from the first work function material.

In another embodiment, a circuit comprises a first field effect transistor having a first threshold voltage, wherein the first field effect transistor comprises a first gate electrode having a first work function material of a first conductivity type; and a second field effect transistor, coupled to the first field effect transistor, having a second threshold voltage that is different from the first threshold voltage. The second field effect transistor comprises a second gate electrode having a second work function material of a second conductivity type that is opposite the first conductivity type, and the first and second field effect transistors are same channel type devices.

In a further embodiment, a method of forming a semiconductor structure comprises forming a plurality of fins on a substrate, where each fin of the plurality of fins has a same conductivity type. A polysilicon gate structure is formed over each fin of the plurality of fins and the at least one polysilicon gate structure is replaced with a metal gate structure. At least one polysilicon gate structure is removed and a first work function layer is deposited over each fin of the plurality of fins having the same conductivity type. The first work function layer is removed from at least one fin of the plurality of fins having the same conductivity type, and a second work function layer is disposed. A metal layer is then deposited over the second work function layer.

It is to be appreciated that the Detailed Description section, and not the Summary or Abstract of the Disclosure sections, is intended to be used to interpret the claims. The Summary and Abstract of the Disclosure sections may set forth one or more but not all embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A voltage reference circuit, comprising:
a first plurality of n-type field effect transistors (NFETs), wherein each NFET of the first plurality of NFETs has a first threshold voltage and comprises a first gate stack with a first work function material of an n-type dopant;
a second plurality of NFETs, wherein:
each NFET of the second plurality of NFETs has a second threshold voltage greater than the first threshold voltage;
each NFET of the second plurality of NFETs comprises a second gate stack, wherein the second gate stack comprises the first work function material and a second work function material of a p-type dopant; and
the second work function material is under the first work function material; and
a terminal of the first or second plurality of NFETs configured to produce an output voltage that decreases in magnitude in response to an increase in temperature.

2. The voltage reference circuit of claim 1, wherein the first and second work function materials are selected such that the output voltage decreases nominally linearly in response to the increase in temperature.

3. The voltage reference circuit of claim 1, wherein the first and second pluralities of NFETs comprise respective first and second gate electrodes, and dimension ratios between the first and second gate electrodes are configured to provide a negative temperature coefficient.

4. The voltage reference circuit of claim 3, wherein the dimension ratios between the first and second gate electrodes are ratios between effective widths and lengths of the first and second gate electrodes.

5. The voltage reference circuit of claim 1, wherein the second gate stack comprises a gate dielectric layer and the second work function material is formed directly on the gate dielectric layer.

6. The voltage reference circuit of claim 1, wherein the first work function material comprises a single continuous layer.

7. The voltage reference circuit of claim 1, wherein the first and second work function materials are in contact with each other.

8. The voltage reference circuit of claim 1, further comprising an isolation region between the first and second pluralities of NFETs, wherein the first work function material is formed above a top surface of the isolation region.

9. The voltage reference circuit of claim 8, further comprising a gate dielectric layer, wherein the gate dielectric layer is formed between the first work function material and the top surface of the isolation region.

10. A circuit, comprising:
a first plurality of n-type field effect transistors (NFETs) having a first threshold voltage, wherein the first plurality of NFETs comprises a first work function material of an n-type conductivity in contact with a gate dielectric layer; and
a second plurality of NFETs, coupled to the first plurality of NFETs, having a second threshold voltage greater than the first threshold voltage, wherein:
the second plurality of NFETs comprises the gate dielectric layer, the first work function material, and a second work function material of a p-type conductivity; and
the second work function material is in contact with the gate dielectric layer and under the first work function material.

11. The circuit of claim 10, wherein the first and second work function materials are selected such that an output voltage of the circuit decreases linearly in response to an increase in temperature.

12. The circuit of claim 10, wherein dimensions of the first and second gate electrodes are configured to provide a negative temperature coefficient of the circuit.

13. The circuit of claim 10, wherein the first work function material comprises a single continuous layer.

14. The circuit of claim 10, further comprising an isolation region between the first and second pluralities of NFETs, wherein the first work function material is formed above a top surface of the isolation region.

15. The circuit of claim 14, wherein the gate dielectric layer is formed between the first work function material and the top surface of the isolation region.

16. A semiconductor structure, comprising:
first and second pluralities of fins of respective first and second pluralities of n-type field effect transistors (NFETs), on a substrate, wherein:
each NFET of the first plurality of NFETs has a first threshold voltage;
each NFET of the second plurality of NFETs has a second threshold voltage greater than the first threshold voltage; and
the first and second pluralities of fins have the same conductivity type;
a gate dielectric layer on the first and second pluralities of fins;
a first work function layer comprising a p-type dopant and in contact with the gate dielectric layer and above each fin of the second plurality of fins;
a second work function layer, wherein:
a first portion of the second work function layer is in contact with the gate dielectric layer and above the first plurality of fins;
a second portion of the second work function layer is above and in contact with the first work function layer; and
the second work function layer comprises an n-type dopant; and
a metal layer on the second work function layer.

17. The semiconductor structure of claim 16, wherein the metal layer comprises tungsten or cobalt.

18. The semiconductor structure of claim 16, wherein the first and second portions of the second work function layer form a single continuous layer.

19. The semiconductor structure of claim 16, further comprising an isolation region between the first and second pluralities of NFETs, wherein the second work function layer is formed above a top surface of the isolation region.

20. The semiconductor structure of claim 19, wherein the gate dielectric layer is formed between the second work function layer and a top surface of the isolation region.

* * * * *